(12) United States Patent
Ito et al.

(10) Patent No.: US 7,557,446 B2
(45) Date of Patent: Jul. 7, 2009

(54) SEMICONDUCTOR DEVICE AND A FABRICATION PROCESS THEREOF

(75) Inventors: Takeshi Ito, Kawasaki (JP); Satoshi Inagaki, Kawasaki (JP); Yasunori Uchino, Kawasaki (JP); Kazuo Kawamura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/216,134

(22) Filed: Jun. 30, 2008

(65) Prior Publication Data

US 2008/0303171 A1  Dec. 11, 2008

Related U.S. Application Data

(62) Division of application No. 11/355,992, filed on Feb. 17, 2006, now Pat. No. 7,407,888.

(30) Foreign Application Priority Data

Jun. 17, 2005  (JP)  ............................. 2005-177220
Jan. 13, 2006  (JP)  ............................. 2006-006292

(51) Int. Cl.
*H01L 23/52* (2006.01)
(52) U.S. Cl. ........................ 257/751; 257/757; 257/758; 257/763; 257/764; 257/E23.163
(58) Field of Classification Search ................. 257/750, 257/751, 757, 758, 763, 764, 770, E23.163
See application file for complete search history.

(56) References Cited

U.S. PATENT DOCUMENTS 6,087,257 A  7/2000  Park et al.
6,093,642 A  7/2000  Cho et al.
6,162,715 A  12/2000  Mak et al.
6,271,122 B1 *  8/2001  Wieczorek et al. .......... 438/627
6,309,713 B1  10/2001  Mak et al.
2004/0029377 A1  2/2004  Lee et al.
2004/0171241 A1  9/2004  Kitamura et al.
2004/0219298 A1 *  11/2004  Fukunaga et al. ........... 427/304
2004/0227242 A1 *  11/2004  Noguchi et al. ............. 257/751

FOREIGN PATENT DOCUMENTS

| JP | 08-045878 A | 2/1996 |
| JP | 11-214650 A | 8/1999 |
| JP | 2000-106398 A | 4/2000 |

\* cited by examiner

*Primary Examiner*—Charles D. Garber
*Assistant Examiner*—Angel Roman
(74) *Attorney, Agent, or Firm*—Westerman, Hattori, Daniels & Adrian, LLP.

(57) ABSTRACT

A semiconductor device formed by the steps of forming a contact hole in an insulation film so as to extend therethrough and so as to expose a conductor body at a bottom part of the contact hole, forming a barrier metal film of tungsten nitride on the bottom part and a sidewall surface of the contact hole with a conformal shape to the bottom part and the sidewall surface of the contact hole, forming a tungsten layer so as to fill the contact hole via the barrier metal film, and forming a tungsten plug in the contact hole by the tungsten layer by polishing away a part of the tungsten film on the insulation film until a surface of the insulation film is exposed, wherein there is conducted a step of cleaning a surface of the conductor body prior to the forming step of the barrier metal film.

3 Claims, 17 Drawing Sheets

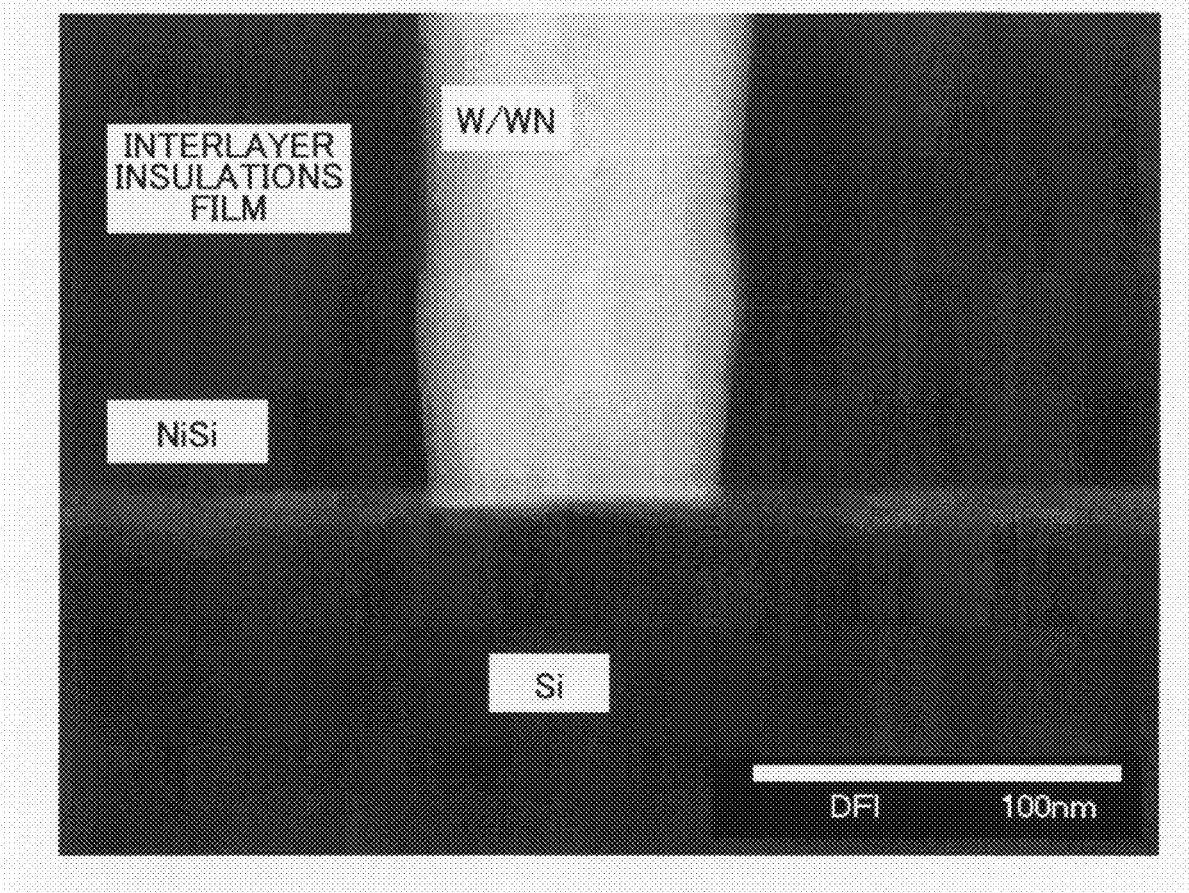

SEMICONDUCTOR DEVICE AND A FABRICATION PROCESS THEREOF

CROSS-REFERENCE TO RELATED APPLICATION

The present application is a divisional of application Ser. No. 11/355,992, filed on Feb. 17, 2006, which is based on Japanese priority applications No. 2005-177220 filed on Jun. 17, 2005 and No. 2006-006292 filed on Jan. 13, 2006, the entire contents of which are hereby incorporated by reference.

BACKGROUND OF THE INVENTION

The present invention generally relates to semiconductor devices and more particularly to the fabrication process of a semiconductor device that has a contact structure contacting with a diffusion region or gate electrode formed on a semiconductor substrate.

In the art of MOS semiconductor integrated circuit devices, increase of integration density and decrease of device size are steadily in progress for the purpose of achieving higher operational speed, diversified functions, larger storage capacities and lower power consumption. Today, there emerged semiconductor devices that have a gate length of less than 100 nm. With such ultra-miniaturized semiconductor devices, there arise various problems to be solved, and innovation of technology has become inevitable.

Patent Reference 1 Japanese Laid-Open Patent Application 8-45878 official gazette Patent Reference 2 Japanese Laid-Open Patent Application 11-214650 official gazette

SUMMARY OF THE INVENTION

Conventionally, vertical interconnection structures such as a contact structure have been used for electrically connecting a diffusion region and an interconnection in the semiconductor devices that are formed on a silicon substrate.

In such a contact structure, electric interconnection is achieved to the surface of the diffusion region by way of a contact plug, while, in such a contact structure, it has been practiced to form a barrier metal film on the surface of the contact hole by way of consecutively sputtering a metal film such as a titanium film and a metal nitride film such as titanium nitride for the purpose of reducing the contact resistance of the silicide layer formed on the surface of the impurity diffusion region and further for suppressing the diffusion of elements between the contact plug and the silicide material.

Particularly, in the ultra-miniaturized semiconductor devices having the gate length of 60 nm or less and characterized by large aspect ratio (depth/width ratio) for the contact holes such as the ultra-miniaturized semiconductor device having the gate length of 60 nm or less, it has been practiced in the art to form a metal film such as titanium by a sputtering process so as to cover the inner wall surface of the contact hole and further the silicide layer formed on the surface of the diffusion region and exposed at the bottom of the contact hole, and a metal nitride film of titanium nitride, or the like, has been formed on such a metal film by way of a metal-organic CVD (MOCVD) process that has the feature of good step coverage.

After covering the bottom surface and the sidewall surface of the contact holes with the barrier metal film, a layer typically formed of tungsten is formed so as to fill the contact hole by way of a CVD process while using a $WF_6$ gas, a $SiH_4$ gas and a hydrogen gas as the source gases.

Contact structure in multilayer interconnection structures is formed similarly. Thus, there is formed a barrier metal film by a metal film such as titanium and a metal nitride film such as titanium nitride wherein the barrier metal film functions also as adherence film, and a via-plug is formed by filling the contact hole by a CVD process via the barrier metal film.

In the case of forming a barrier metal film in such a contact hole so as to function also as an adherence layer and further filling the contact hole by a buried metal film constituting a contact plug, it has been practiced in the art to use different growth chambers for the sputtering process of the titanium film and for the MOCVD process of the titanium nitride film in view of difference of preferable deposition temperatures and in view of saving time needed for temperature rise.

However, the titanium film constituting the lower layer part of the barrier metal film easily undergoes oxidation or contamination, and thus, there has been a need of conducting the formation of the titanium nitride film as quickly as possible after formation of the titanium film in the conventional process of barrier metal film formation.

However, with such a process of forming a titanium film by using a sputtering apparatus and forming a titanium nitride film thereafter by using an MOCVD apparatus, it has been difficult to eliminate the problem of increase of the contact resistance caused by oxidation or contamination of the titanium film, even in the case a single-wafer substrate processing apparatus is used for this process. It should be noted that it is not possible to decrease the time for transferring the substrate from the sputtering apparatus to the MOCVD apparatus to zero even when a single-wafer substrate processing is used.

Further, with recent ultra-miniaturized semiconductor devices of short gate length, the depth of the junctions is decreased significantly for the purpose of suppressing short channel effect. Thus, there is a demand of conducting the formation of such a barrier metal or deposition of the buried metal film at a low temperature of 400° C. or less. However, with the contact structure thus formed at such low temperatures, the problem of contact resistance becomes even more serious problem.

According to a first aspect, the present invention provides a method of fabricating a semiconductor device having a contact structure comprising a conductor body, an insulation film covering said conductor body, and a contact plug penetrating through said insulation film and electrically connected to said conductor body, said method comprising the steps of:

forming a contact hole in said insulation film to extend therethrough and to expose said conductor body at a bottom part of said contact hole;

forming a barrier metal film of tungsten nitride over said bottom part and a sidewall surface of said contact hole with a conformal shape to said bottom part and said sidewall surface of said contact hole;

forming a tungsten layer to fill said contact hole via said barrier metal film; and forming a tungsten plug in said contact hole by said tungsten layer by polishing away a part of said tungsten film over said insulation film until a surface of said insulation film is exposed, wherein there is conducted a step of cleaning a surface of said conductor body prior to said forming step of said barrier metal film.

In another aspect, the present invention provides a semiconductor device having a contact structure, said contact structure comprising:

a conductor body;

an insulation film covering said conductor body;

a contact hole penetrating through said insulation film and exposing said conductor body; and a contact plug filling said contact hole and contacting with said conductor body electrically at a bottom part of said contact hole, wherein said conductor body comprises a silicide film, said contact plug comprising a barrier metal film of tungsten nitride extending along a sidewall surface and a bottom surface of said contact hole and a tungsten plug formed over said barrier metal film to fill said contact hole, said barrier metal film having a concentration gradient that decreases a nitrogen concentration with increasing distance from said sidewall surface of said contact hole, said barrier metal film contacting with said conductor body directly and intimately at a depressed part formed over a surface of said conductor body with a depth of 5-8 nm.

According to the present invention, it becomes possible, at the time of forming a tungsten plug in a semiconductor device by filling a contact hole with a tungsten film via a tungsten nitride barrier metal film, to achieve a contact of low resistance stably even in the case the surface of the conductor body to which the tungsten plug makes contact is oxidized or contaminated and there is formed an unpreferable high resistance layer, by removing such a high resistance layer by conducting a cleaning step in advance of the deposition of the tungsten nitride barrier metal film. Particularly, it is preferable, with ultra high-speed logic semiconductor devices having a shallow contact, to conduct such a cleaning step such that the surface of the silicide film, or the like, to which the tungsten plug makes contact, is etched for the thickness of about 5-8 nm.

It is advantageous to conduct the foregoing cleaning step by a sputter etching process conducted in the ambient of an Ar gas and a hydrogen gas. By doing so, it should be noted that the sputtering rate becomes low and damaging to the conductor body is successfully suppressed.

Further, it should be noted that the present invention is not limited to logic semiconductor devices but is useful also at the time of low resistance via-contacts of multilayer interconnection structure.

It should be noted that the tungsten nitride barrier metal film of the present invention functions also as an adhesion film, and it becomes possible to improve the adherence between the contact hole and the underlying conductor body. Particularly, by forming the barrier metal film of tungsten nitride such that the nitrogen concentration in the film decreases continuously from the interface to the conductor body toward the tungsten plug, the interface between the tungsten plug and the tungsten nitride barrier metal film vanishes, and excellent adherence is attained between the tungsten plug and the barrier metal film.

Other objects and further features of the present invention will become apparent from the following detailed description when read in conjunction with the attached drawings.

BRIEF DESCRIPTION OF THE DRAWINGS

FIGS. 7A and 7B are further diagrams showing the effect of the present invention.

DETAILED DESCRIPTION OF THE INVENTION

First Embodiment

Hereinafter, the fabrication process of a semiconductor device according to a first embodiment of the present invention will be explained with reference to FIGS. 1A-1F.

Figure 1A:
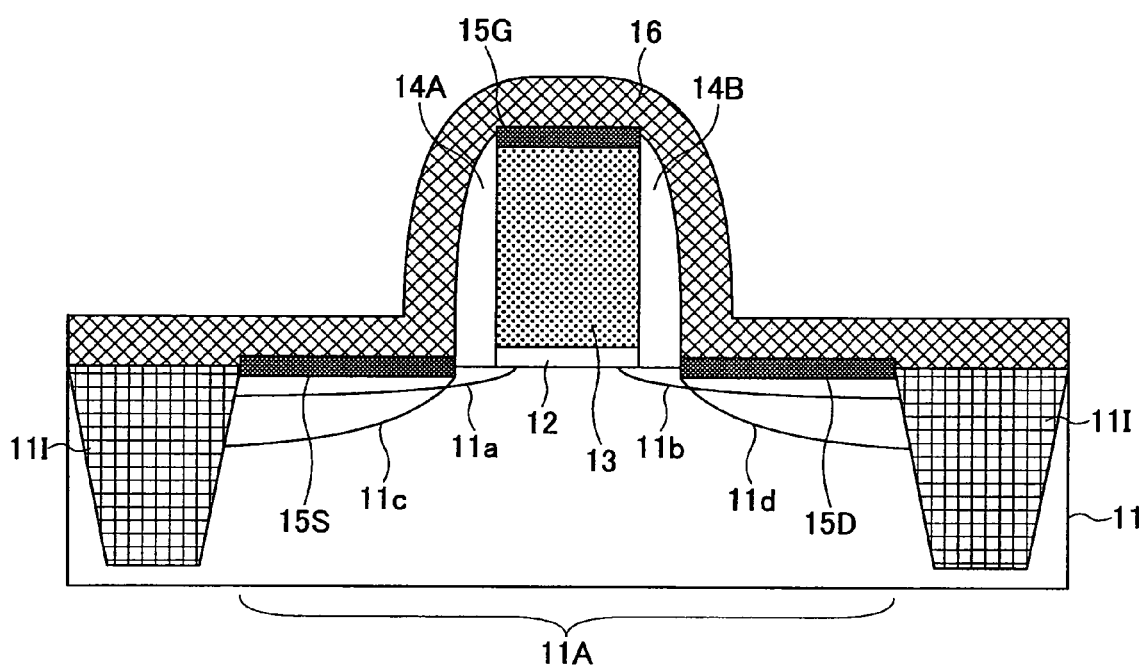
FIGS. 1A-1G are diagrams showing the fabrication process of a semiconductor device according to a first embodiment of the present invention.

Referring to FIG. 1A, the semiconductor device of the present embodiment is an n-channel MOS transistor and is constructed on a silicon substrate 11 of p-type in correspondence to a device region 11A of formed of a p-type well (not shown) defined by a device isolation structure 11I.

Thus, there is formed a polysilicon gate electrode 13 doped to $n^+$-type on the device region 11A via a gate insulation film 12 of an SiON film formed on the silicon substrate 11 with a thickness of 1-2 nm, with a gate length of 30 nm, for example, and source and drain extension regions 11a and 11b of n-type are formed in the silicon substrate at respective sides of the gate electrode 13 with a junction depth of about 15 nm, by conducing ion implantation of As+ under the acceleration voltage of 1 keV with a dose of $1 \times 10^{15}$ cm$^{-2}$.

Further, there are formed sidewall insulation films 14A and 14B of SiN, or the like, on respective sidewall surfaces of the polysilicon gate electrode 13, and source and drain regions 11c and 11d of $n^+$-type are formed in the silicon substrate 11 at respective outer sides of the sidewall insulation films 14A and 14B with a junction depth of 90 nm, wherein the source and drain regions 11c and 11d are formed by conducting ion implantation of As+ under the acceleration voltage of 35 keV with a dose of $2 \times 10^{15}$ cm$^{-2}$.

Further, on the respective exposed surfaces of the diffusion regions 11c, 11d and polysilicon gate electrode 13, there are formed low-resistance silicide layers 15S, 15D and 15G of NiSi by a salicide process, with the thickness of 20 nm, for example. Here, it should be noted that the silicide layers 15S, 15D and 15G are not limited to NiSi, but it is also possible to use $CoSi_2$, $TaSi_2$, $TiSi_2$, PtSi, or the like.

In the case of forming the silicide layers 15S, 15D and 15G by NiSi, a Ni film is deposited on the diffusion regions 11c, 11d and the polysilicon gate electrode 13 and reaction is caused for the Ni film for the duration of several seconds at the temperature of 300-500° C. Thereafter, unreacted Ni film is removed by a mixture of sulfuric acid and hydrogen peroxide solution.

On the other hand, in the case of forming a $CoSi_2$ film, a Co film is deposited on the exposed surfaces of the diffusion regions 11c, 11d and the polysilicon gate electrode 13 and reaction is caused by annealing at the temperature of 500-700° C. for several seconds.

It should be noted that such a MOS transistor of short gate length and shallow junction depth operates at very high speed with low electric power consumption and is used for logic semiconductor devices.

Thus, with the n-channel MOS transistor of FIG. 1A, there is formed a silicon nitride stressor film 16 accumulating therein a tensile stress of typically 1 GPa on the device region 11A so as to cover the surface of the silicon substrate 11 and the sidewall insulation films 14A and 14B of the gate electrode 13 continuously.

By forming such a silicon nitride strain film 16 having a tensile stress so as to cover the sidewall insulation films of the gate electrode 13, the gate electrode 13 is urged against the silicon substrate 11, and a compressive stress is applied to the channel region right underneath the gate electrode 13 in the direction perpendicular to the substrate surface. Thereby, mobility of electrons is increased in the channel region.

In the case of p-channel MOS transistor, the source region 11c and the drain region 11d are formed by epitaxial regrowth of a SiGe mixed crystal of large lattice constant that functions to expand the silicon substrate 11 in the direction perpendicular to the substrate surface. With this, there is induced a compressive stress in the channel region right underneath the gate electrode 13 in the direction parallel to the substrate surface, and mobility of holes is increased in the channel region.

Figure 1B:
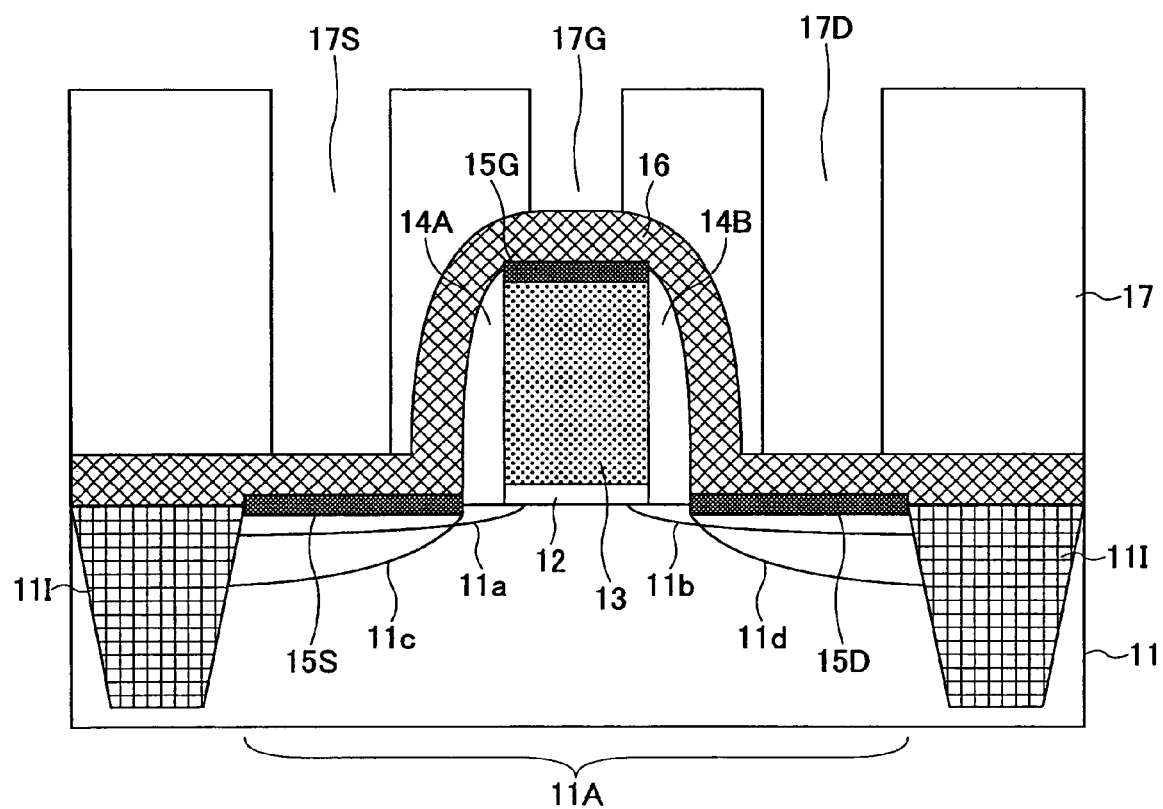

Next, in the step of FIG. 1B, there is formed an insulation film 17 of silicon oxide on the structure of FIG. 1A, and there are formed contact holes 17S, 17D and 17G in the insulation film 16 respectively in correspondence to the silicide films 15S, 15D and 15G by a patterning process conducted by an RIE process that uses a mixture of a $CF_4$ gas and a hydrogen gas, for example, wherein the contact holes 17S, 17D and 17G are formed so as to expose the silicon nitride stressor film 16.

Figure 1C:
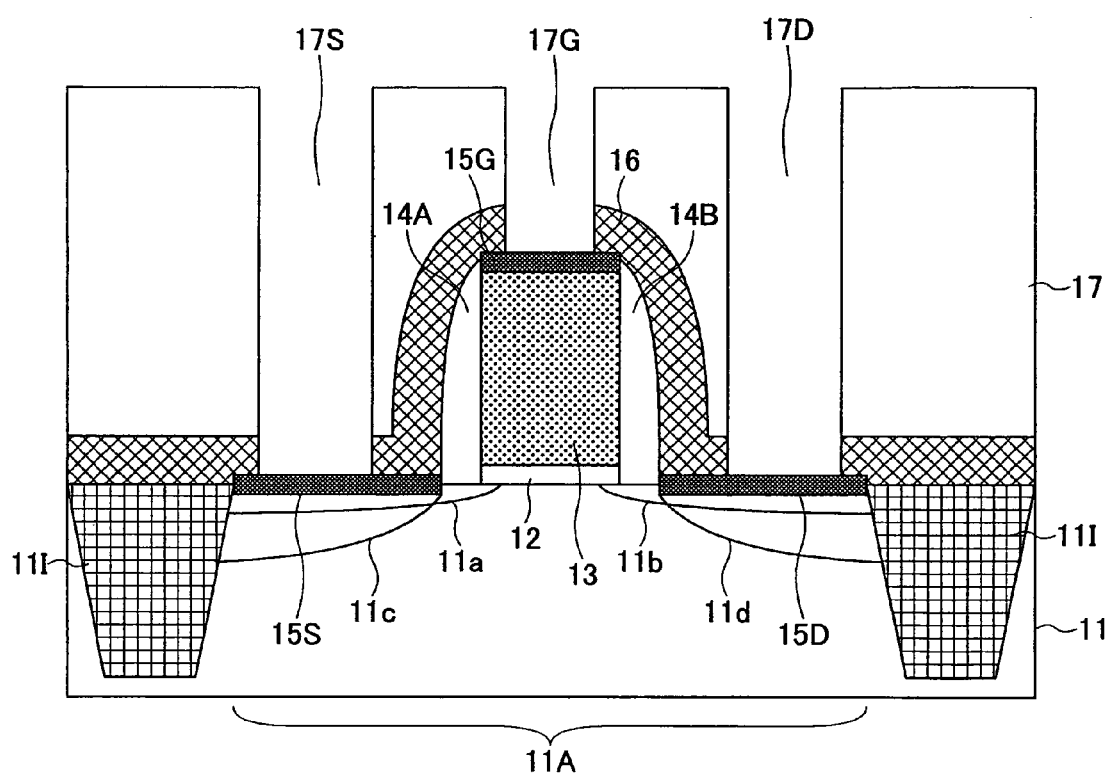

Further, in the step of FIG. 1C, the silicon nitride stressor film 16 exposed at the bottom of the contact holes 17S, 17D and 17G is etched by an RIE process that uses a $C_xH_yF_z$ gas, and the silicide films 15S, 15D and 15G are exposed.

Figure 1D:
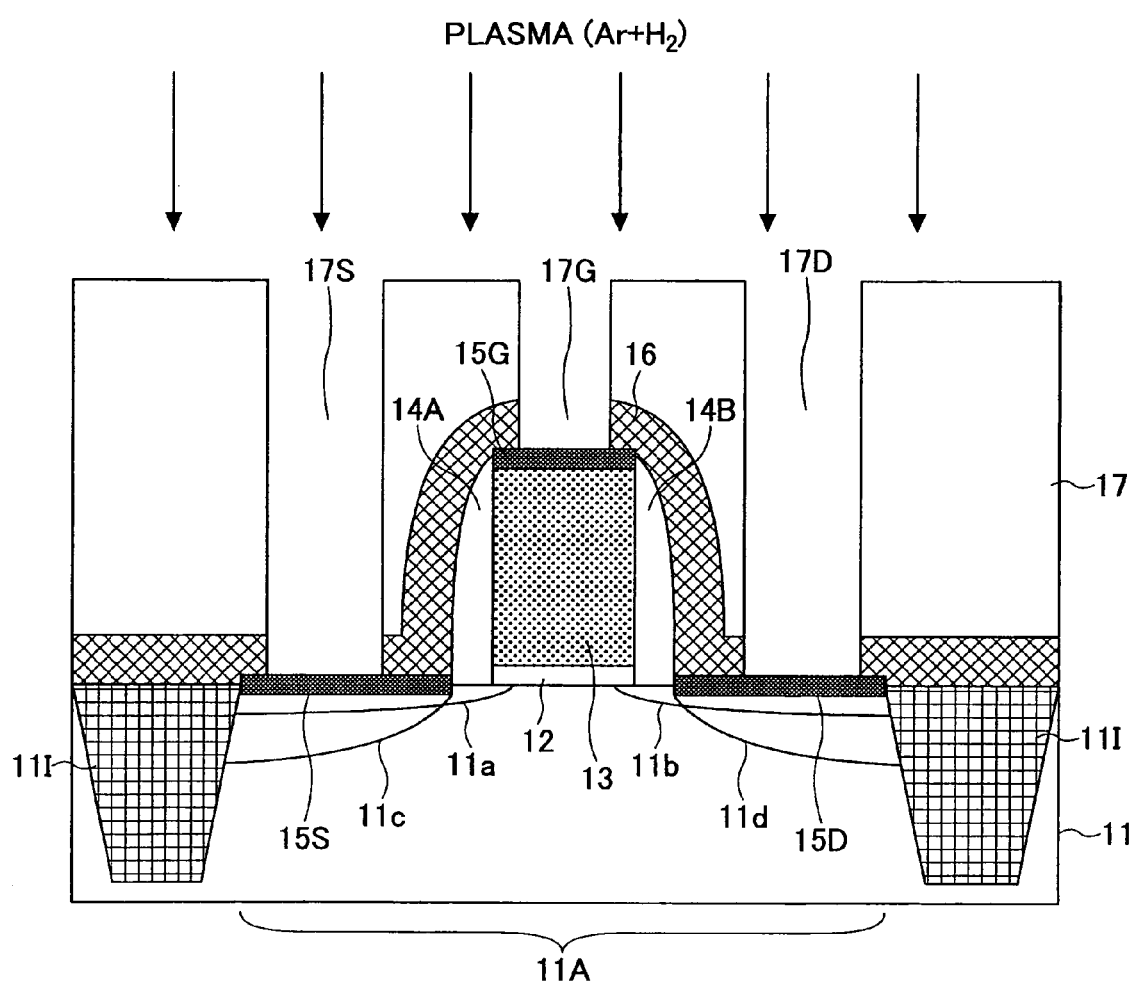

Next, in the step of FIG. 1D, sputter etching is conducted to the structure of FIG. 1C in the ambient of an Ar gas and a hydrogen gas, and a high resistance layer is removed from the surface of the suicide films 15S, 15D and 15G.

Figure 2:
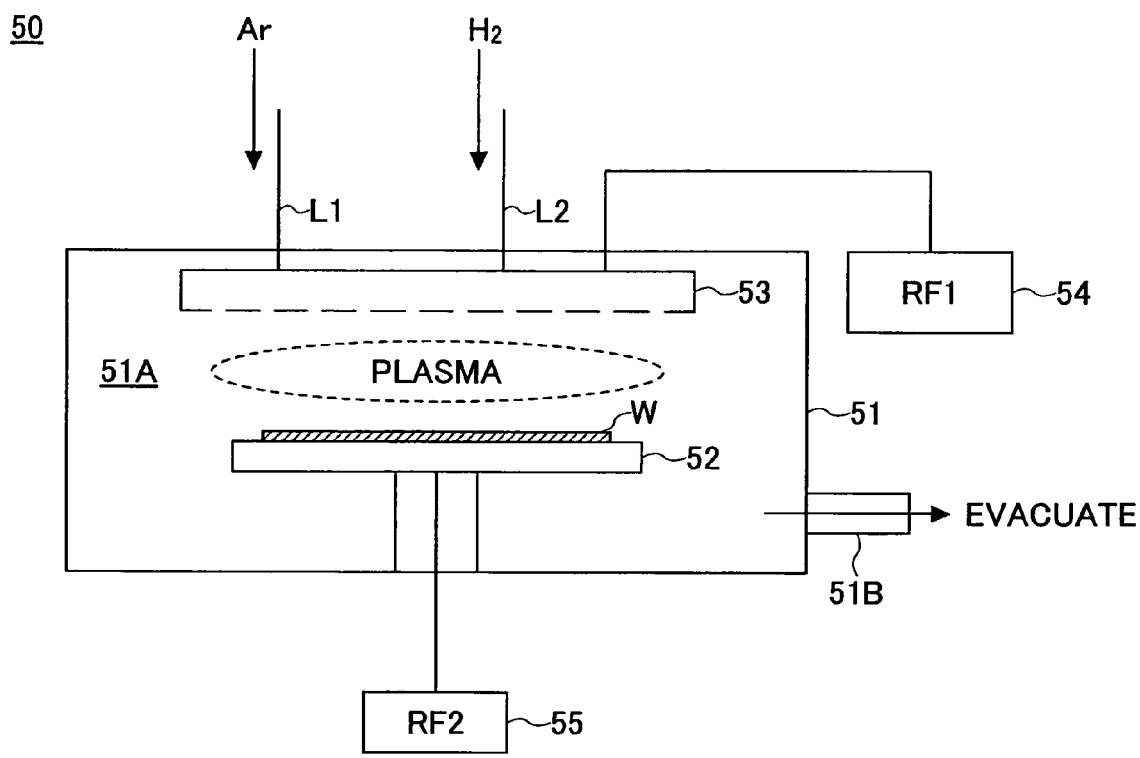
FIG. 2 is a diagram showing the construction of a plasma processing apparatus used with the step of FIG. 1D.

More specifically, the structure of FIG. 1C is introduced into a processing vessel 51 of a down-flow plasma processing apparatus 50 of parallel plate type shown in FIG. 2 preferably via a vacuum transfer chamber, wherein the structure thus introduced is held upon a stage 52 provided in the processing vessel 51 as a substrate W to be processed at a substrate temperature of room temperature to 200° C., such as the temperature of 200° C. Further, the pressure in the processing space 51A in the processing vessel 51 is held at 0.5 mTorr, for example, by evacuating through an evacuation port 51B. Further, an Ar gas and a hydrogen gas are introduced via a showerhead 53 provided so as to face the substrate W under processing respectively via gas lines L1 and L2 with respective flow rates of 10-30 SCCM and 10-30 SCCM.

Further, a radio frequency power of 500 W is supplied to the showerhead 53 from an RF power source 54 with the frequency of 400 kHz, and plasma of the Ar gas and the hydrogen gas (hydrogen plasma) is formed in the processing space 51A. Further, a substrate bias is formed by providing an RF power of 100-300 W to the stage 52 from an RF power source at the frequency of 13.56 MHz.

By conducting such hydrogen plasma processing for 10-40 seconds, the high resistance layer formed on the silicide layers 15S, 15D and 15G as a result of oxidation or contamination is removed. With the formation step of the silicide layers 15S, 15D and 15G, it should be noted that a wet etching process is conducted at the time of removal of the unreacted metal film, and there is a good chance that oxygen is incorporated into the silicide layer in this step.

Particularly, in the case the foregoing cleaning processing is conducted in the plasma of the Ar gas and the hydrogen gas, there is caused a decrease of etching rate, and advantageous effect of reduced damaging is achieved for the silicide layers 15S, 15D and 15G. Thereby, it is preferable to set the etching rate to about 0.2 nm/second in terms of the equivalent thermal oxide film thickness.

By conducting the cleaning processing in the Ar plasma added with hydrogen, it becomes possible to control the amount of etching of the silicide layer in the cleaning processing step of FIG. 1C to the range of 5-8 nm for the case of using NiSi for the silicide layers 15S, 15D and 15G.

It should be noted that the cleaning step of FIG. 1D can be conducted also by a chemical processing by supplying an $NF_3$ gas or a hydrogen gas in the plasma processing apparatus of FIG. 2.

In this case, plasma processing is conducted under the pressure of 133-399 Pa (1-3 Torr) at the substrate temperature of 200-350° C. while supplying the $NF_3$ gas with the flow rate of 10-30 SCCM or supplying the hydrogen gas with the flow rate of 10-30 SCCM.

Further, it should be noted that the cleaning processing of FIG. 1D is conducted also by causing plasma excitation of a hydrogen gas. Alternatively, it is possible to conduct the cleaning processing by a sputter-etching process.

Figure 1E:
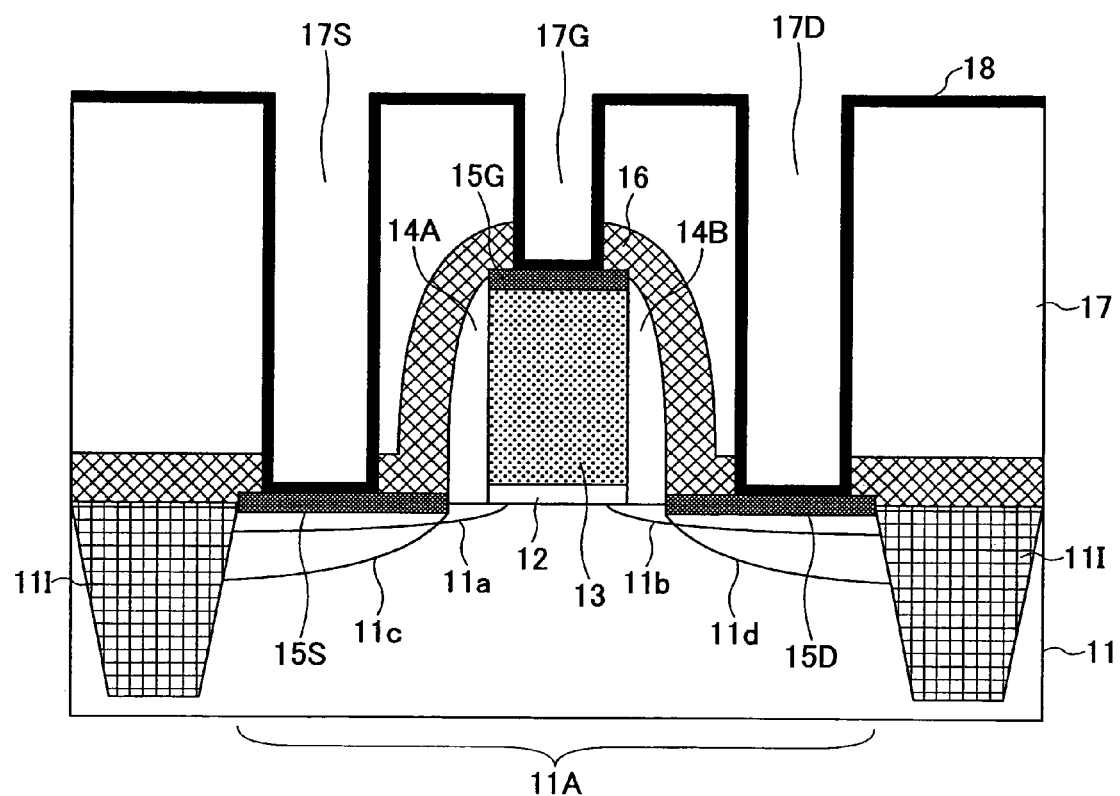
Figure 3:
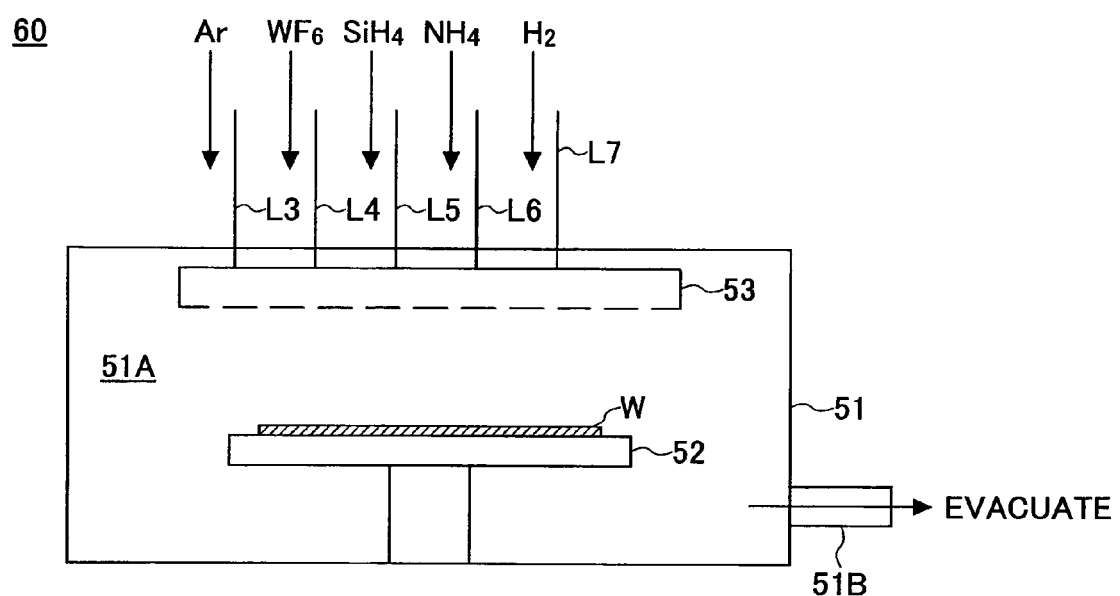
FIG. 3 is a diagram showing the construction of a plasma processing apparatus used with the steps 1E and 1F.

Next, in the step of FIG. 1E, the structure obtained with the step of FIG. 1D is introduced into a down-flow plasma processing apparatus 60 of parallel plate type of FIG. 3 similar to the apparatus of FIG. 2. Thus, in FIG. 3, those parts corresponding to the parts described previously are designated by the same reference numerals and the description thereof will be omitted.

With the plasma processing apparatus 60, gas lines L3-L7 are connected to the showerhead 53, and in the step of FIG. 1E, the substrate W under processing is held upon the stage 52 of the plasma processing apparatus 60 at the temperature of 200-400° C., preferably 300° C. Further, the processing pressure in the processing space 51A is set to 200 Pa, for example, and an Ar gas, a $WF_6$ gas, a $SiH_4$ gas, a $NH_3$ gas and a hydrogen gas are supplied respectively via gas lines L3-L7 initially with respective flow rates of 5000 SCCM, 80 SCCM, 5 SCCM, 160 SCCM and 2000 SCCM, to form a barrier metal film 18 of a tungsten nitride composition, such that the barrier metal film 18 is formed on insulation film 17 including the sidewall surfaces and bottom surfaces of the contact holes 17S, 17D and 17G with a thickness of about 5 nm as shown in FIG. 1E. Thereby, it should be noted that the $SiH_4$ gas may be replaced with a $B_2H_6$ gas.

Thereby, the present embodiment decreases the flow rate of the $WF_6$ gas supplied from the line L4 gradually with deposition of the barrier metal film 18 with the rate of 3 SCCM/second, for example, and the flow rate of the hydrogen gas supplied from the line L7 is increased gradually. As a result, the nitrogen concentration in the barrier metal film 18 is decreased gradually, resulting in formation of a compositional gradient.

Finally, the $NH_3$ gas flow rate becomes zero, and the WF6 gas and the hydrogen gas are supplied with respective flow rates of 80 SCCM and 5000 SCCM under the pressure of 1000 Pa. Thereby, the process proceeds to the deposition step of the tungsten film 19.

Figure 1F:
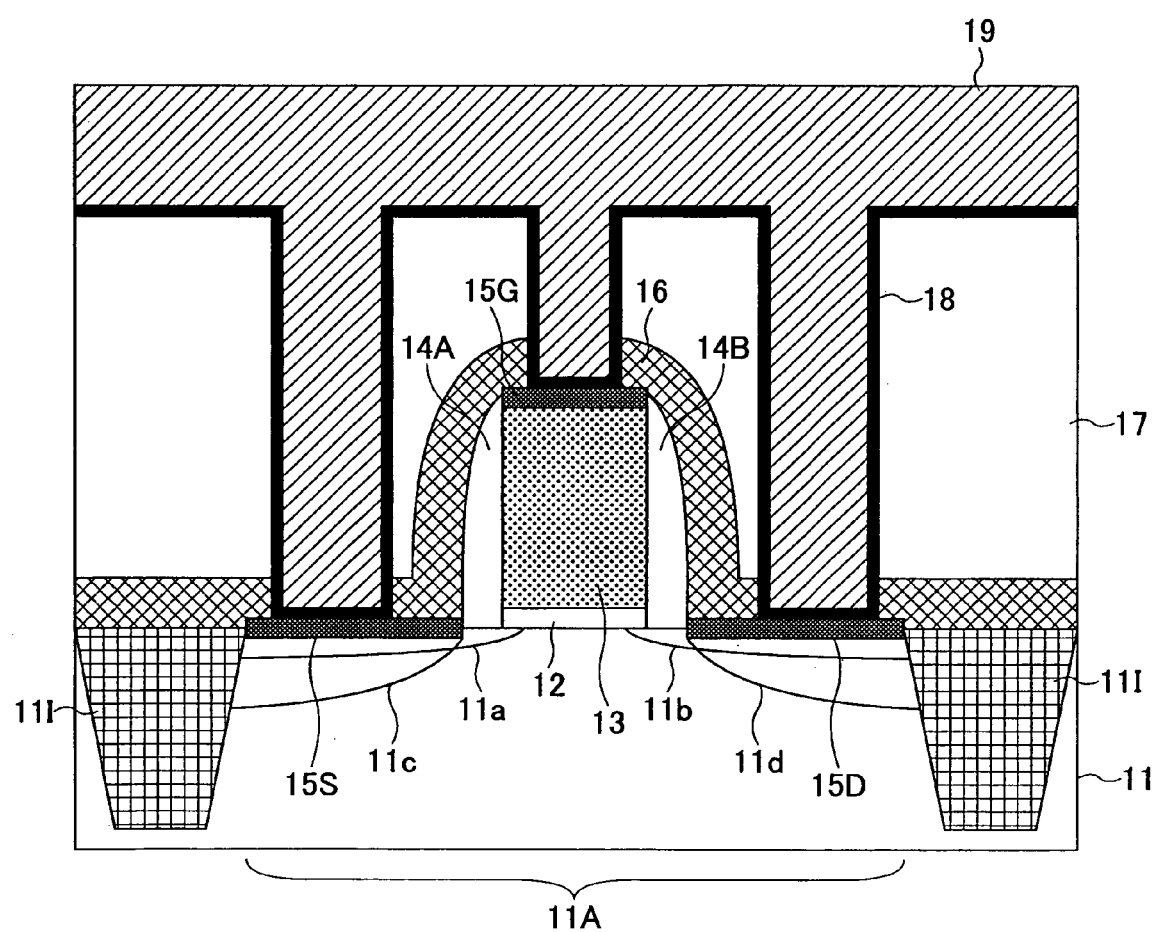

With the step of FIG. 1F, the tungsten film 19 is formed on the insulation film 17 with a thickness of 200 nm, for example, so as to fill the contact holes 17S, 17D and 17G via the barrier metal film 18.

Alternatively, it is possible in the step of FIG. 1E to form the barrier metal film 18 by a so-called ALD (atomic layer deposition) process, in which a $B_2H_6$ gas, a $WF_6$ gas and an $NH_3$ gas are supplied consecutively and repeatedly for 10-60 times with respective flow rates of 50 SCCM, 50-100 SCCM and 100-200 SCCM with intervening Ar purging steps interposed therebetween at the substrate temperature of 200-400° C. under the pressure of 200 Pa.

With such an ALD process, too, it is possible to form a compositional gradient similar to the one explained before in the barrier metal film 18 by decreasing the supply duration of the $NH_3$ gas in each cycle.

Further, with the step of FIG. 1F, it is also possible, at the time of formation of the tungsten film 19, to first conduct a nucleation process under the pressure of 1000 Pa at the temperature of 200-400° C. by supplying only the $SiH_4$ gas or the $B_2H_6$ gas for 60-90 seconds with the flow rate of 5 SCCM, followed by formation of an initiation film by supplying the $wF_6$ gas and the $SiH_4$ gas alternately with respective flow rates of 50 SCCM and 20 SCCM for 5-10 times with intervening Ar purging steps.

In this case, the tungsten film 19 is formed to a predetermined thickness by the reduction region of $WF_6$ by hydrogen by further supplying the $WF_6$ gas and the hydrogen gas with respective flow rates of 80 SCCM and 5000 SCCM.

Figure 1G:
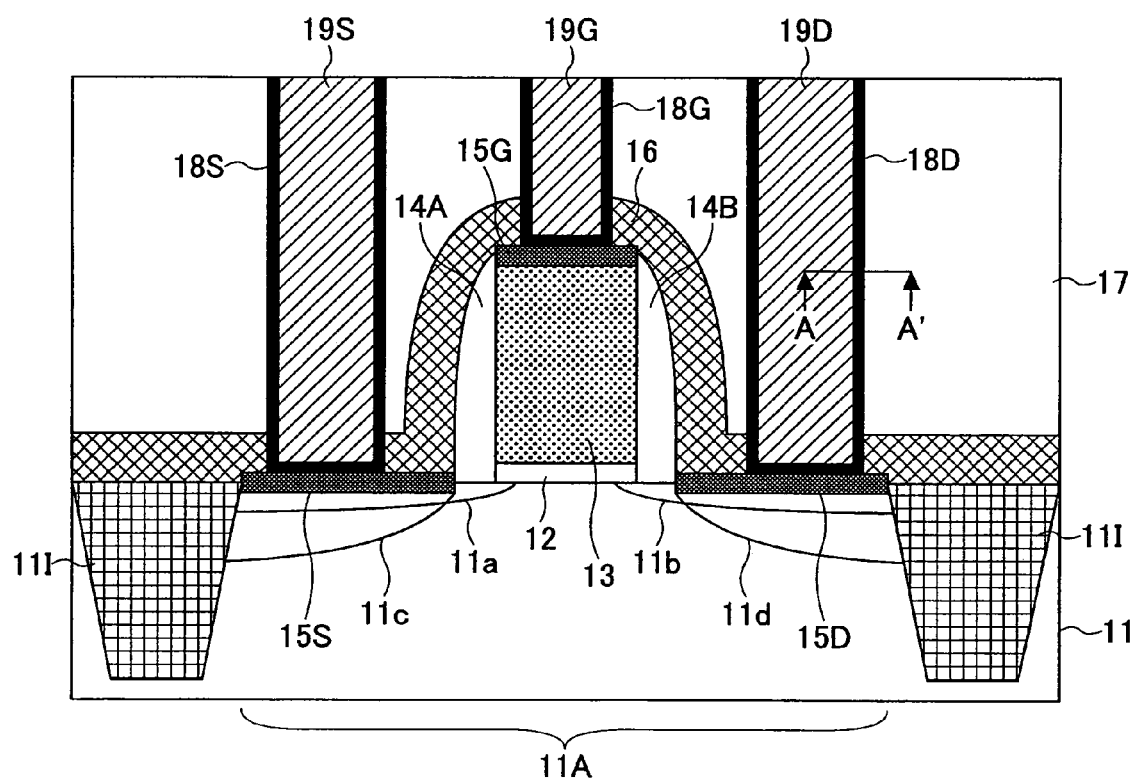

Next, in the step of FIG. 1G, the tungsten film 19 and the underlying barrier metal film 18 are removed from the surface of the insulation film 17 by a chemical mechanical polishing process, and there are formed tungsten plugs 19S, 19D and 19G respectively in the contact holes 17S, 17D and 17G via respective barrier metal films 18S, 18D and 18G.

Figure 4:
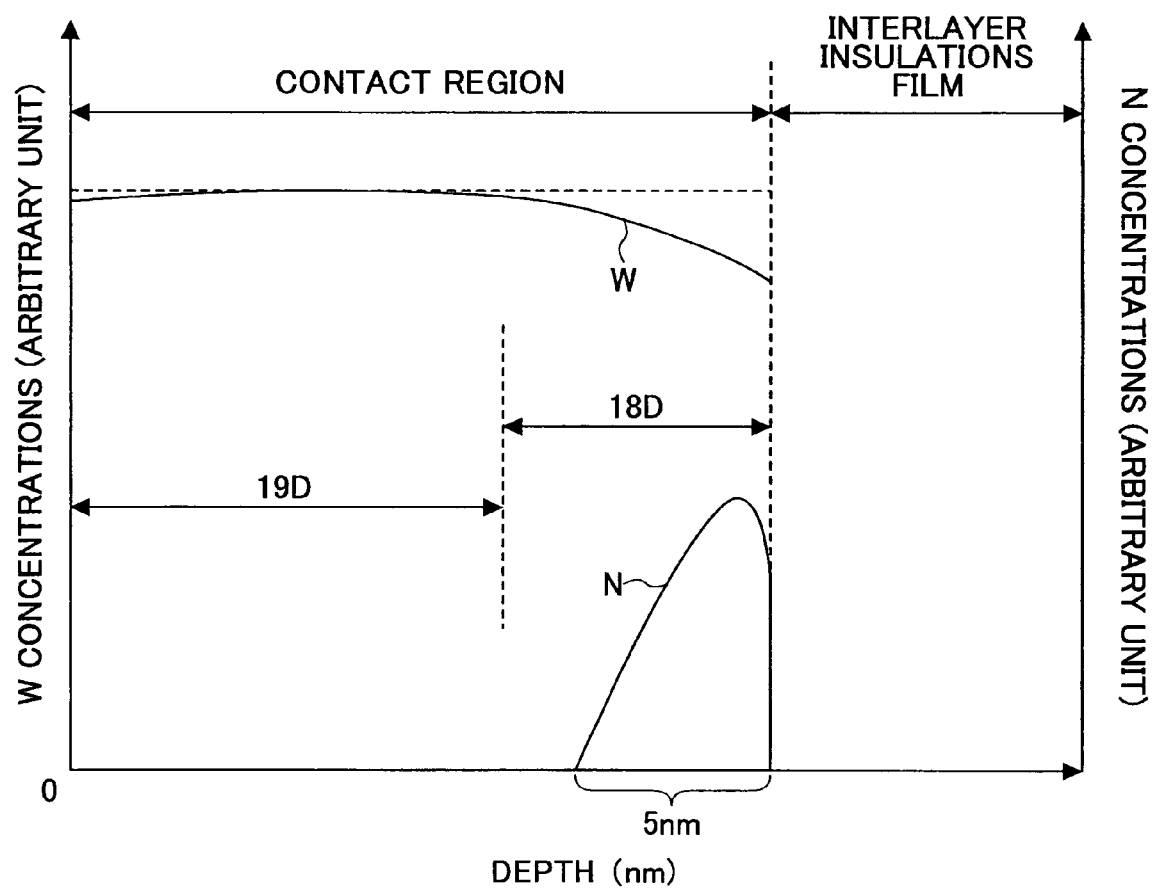
FIG. 4 is a diagram showing an example of the concentration gradient formed in the barrier metal film.

FIG. 4 shows an example of compositional gradient of W and nitrogen in the contact structure of FIG. 1G taken along a cross-section A-A'.

Referring to FIG. 4, it can be seen that there is caused a gradual increase of W concentration in the barrier metal film 18D from the interface to the interlayer insulation film while there is caused a gradual decrease of the nitrogen concentration. With such a contact structure, transition from the barrier metal film 18D to the tungsten plug 19D is caused continuously without interface formation. Thereby, excellent adherence can be attained.

It should be noted that such a barrier metal film having compositional gradient can be formed by so-called ALD process, in which different processing gases are supplied alternately with intervening purging steps as mentioned already. With this case, the same substrate processing apparatus to the one shown in FIGS. 2 and 3 can be used.

Figure 5:
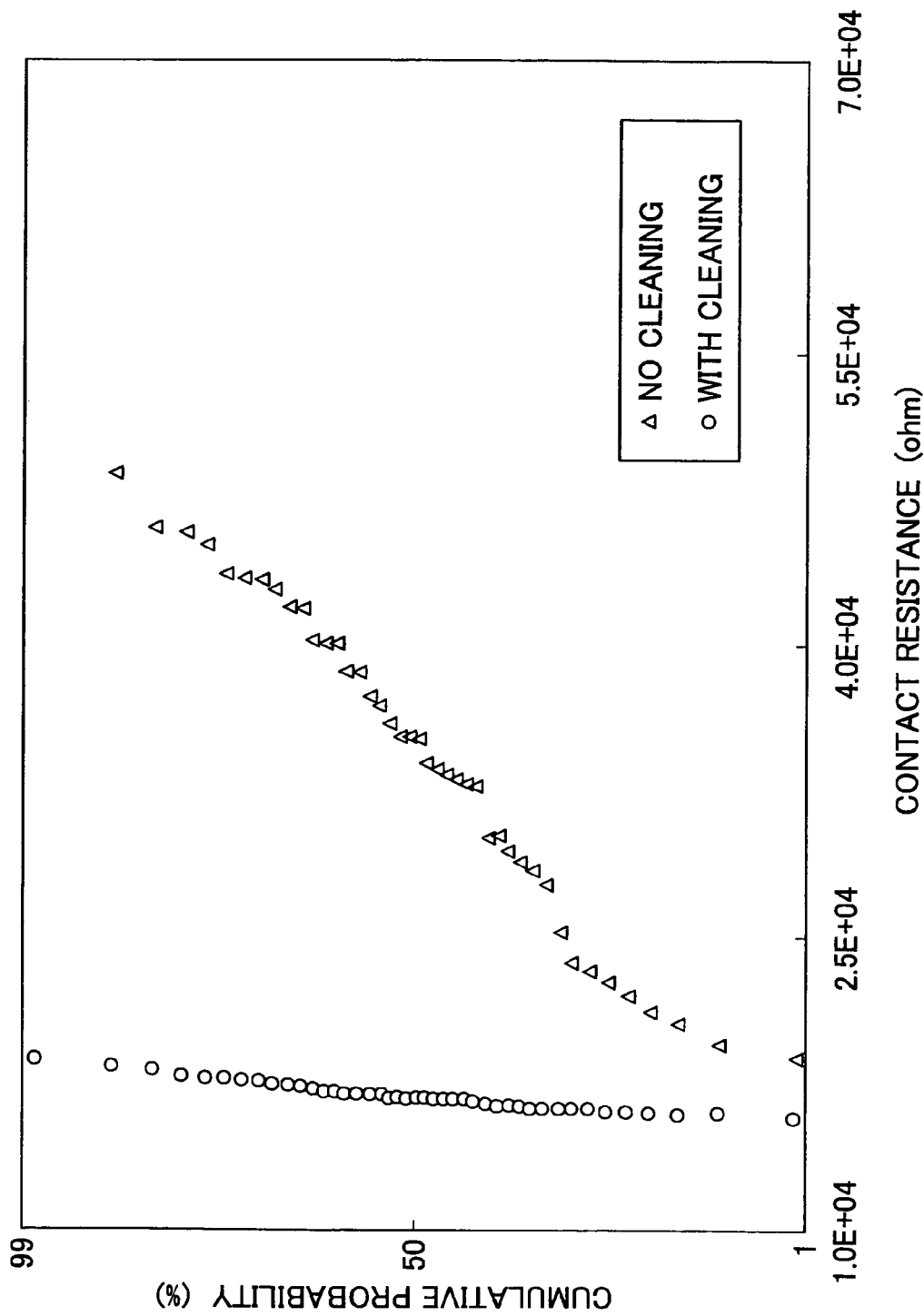
FIG. 5 is a diagram showing the effect of the present invention.

FIG. 5 shows the histogram of contact resistance for the case of forming 1000 via-plugs with the foregoing process.

Referring to FIG. 5, Δ shows the histogram of contact resistance for the case the cleaning step of FIG. 1D is omitted. It can be seen that, with this case, there is caused extensive variation in the contact resistance.

On the other hand, O of FIG. 5 shows the results for the case of conducting the cleaning step of FIG. 1D. It can be seen that, with this case, the variation of contact resistance has been substantially vanished.

Figure 6A:
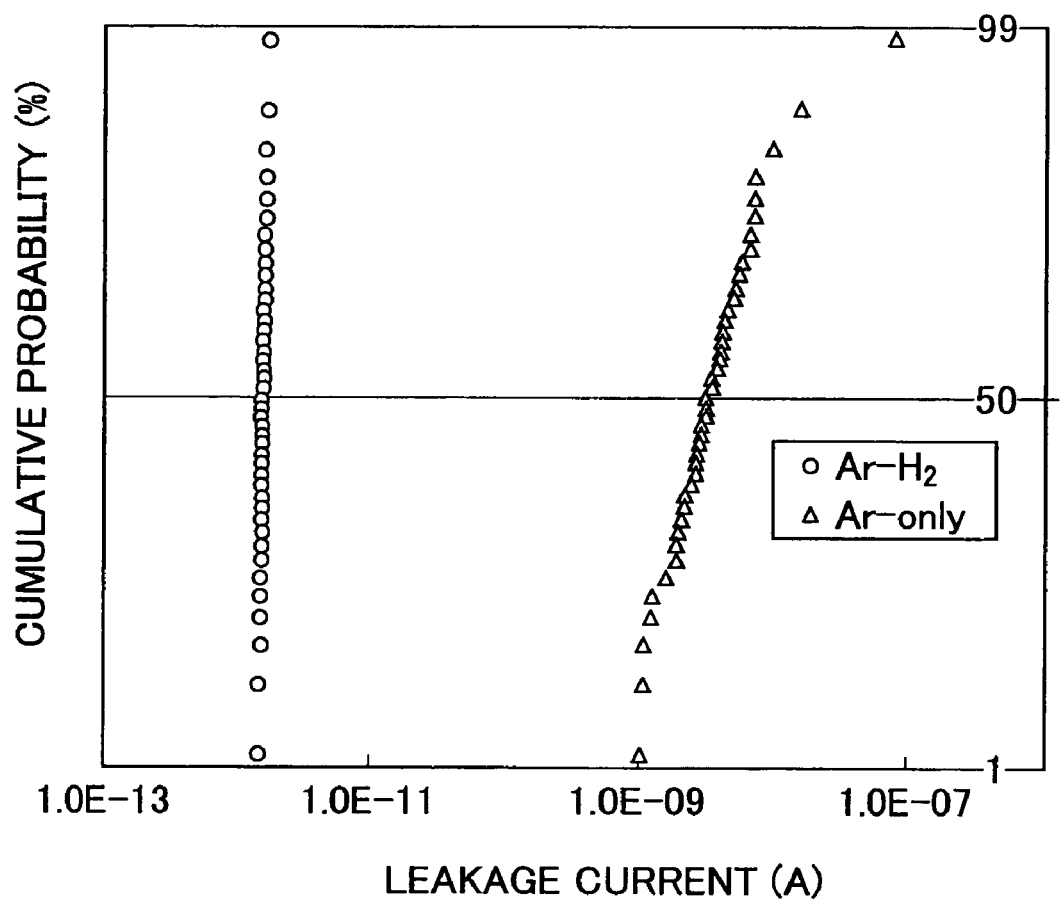
FIGS. 6A and 6B are further diagrams showing the effect of the present invention.

FIG. 6A shows the histogram of leakage current at the source and drain contact of the n-channel MOS transistor fabricated by the foregoing process. In the drawings, O represents the case of conducting the cleaning processing of FIG. 1D by sputter etching in the plasma of Ar and hydrogen according to the teaching of the present embodiment, while Δ represents the case in which the cleaning is conducted solely by the sputtering of Ar.

Referring to FIG. 6A, it can be seen that, by conducting the cleaning processing by the sputter etching in the plasma of Ar and hydrogen, it becomes possible to decrease the leakage current by two digits. Further, it can be seen that variation of the leakage current vanishes substantially. It should be noted that this effect is attained as a result of decrease of the etching rate, which in turn is attained as a result of by conducting the sputter etching processing of the cleaning processing in the plasma of Ar and hydrogen. Thereby, there is caused a decrease of etching rate, and only the damaging layer of high resistance at the surface of the silicide is removed, while leaving the diffusion region substantially free from damages such as defect formation.

Figure 6B:
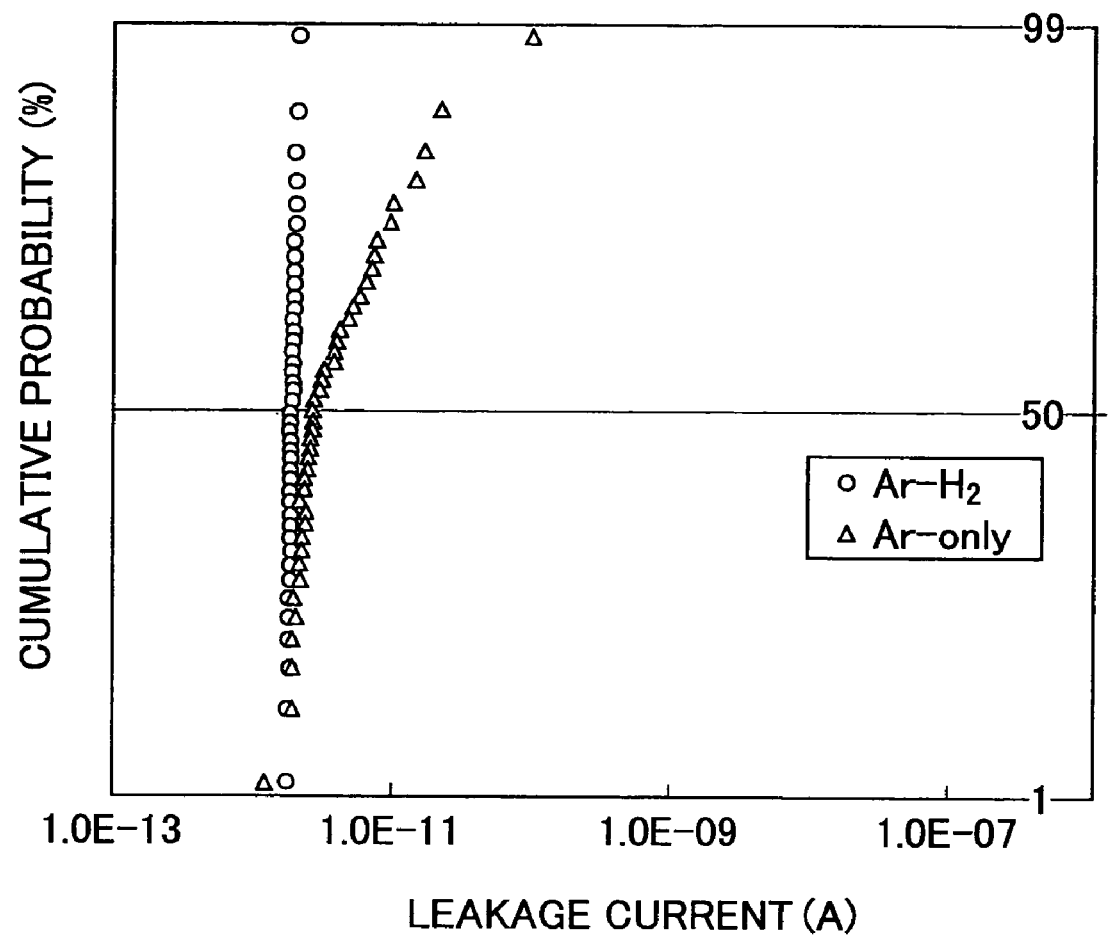

FIG. 6B shows the histogram of leakage current caused at the source and drain contacts for the case a similar cleaning processing is conducted in a p-channel MOS transistor. Similarly to FIG. 5A, O represents the case of conducting the cleaning processing corresponding to the processing of FIG. 1D in the plasma of Ar and hydrogen during the fabrication process of the p-channel MOS transistor, while Δ shows the case in which the cleaning processing is conducted solely by the sputtering by Ar.

Referring to FIG. 6B, it can be seen that, while there is little difference for the absolute value of leakage current between these two different cleaning processes, the variation of the leakage current vanishes more or less in the case the cleaning processing is conducted by way of sputter etching in the plasma of Ar and hydrogen.

Figure 7A:
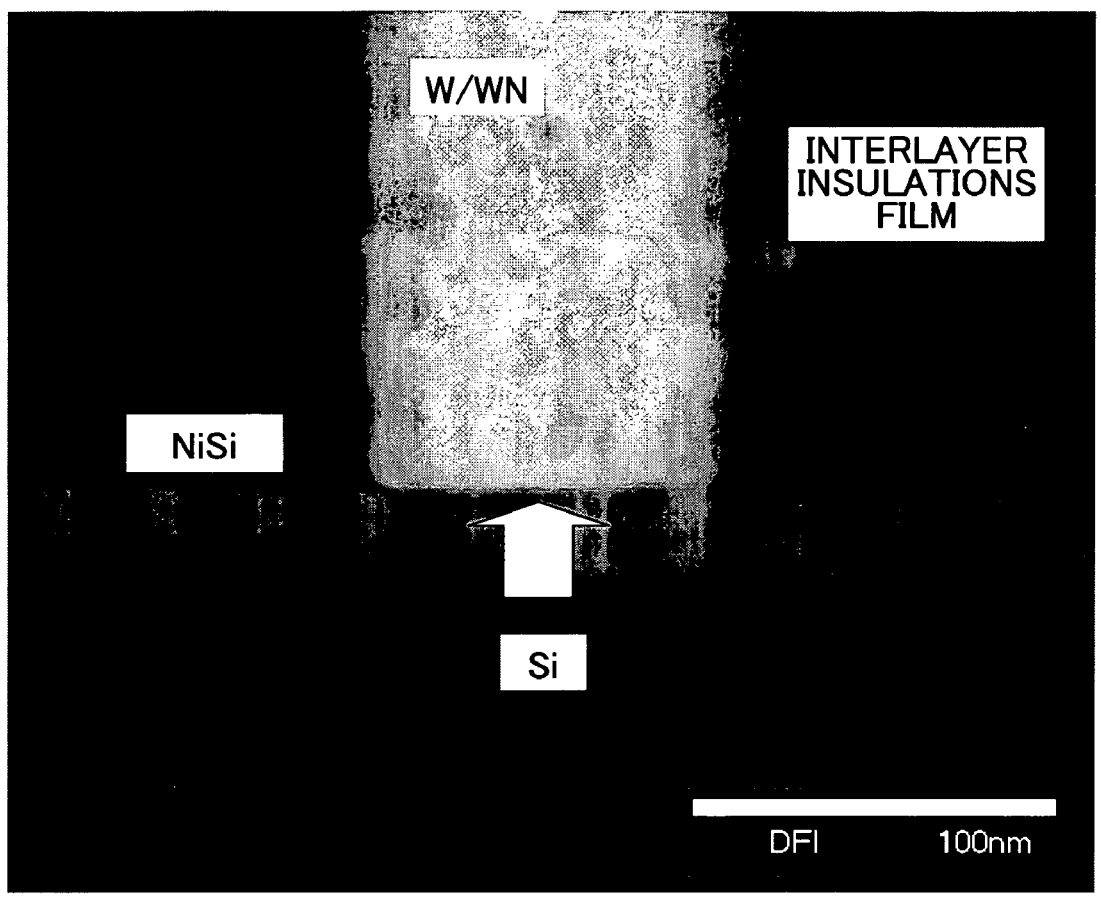

FIG. 7A shows a cross-sectional STEM (scanning transmission electron microscope) photograph for the case the contact structure of FIG. 1G having the tungsten nitride barrier metal film 18S and the tungsten plug 19S is formed without conducting the cleaning step of FIG. 1D. It should be noted that the illustrated cross-sectional STEM photograph is a dark view image and the part formed of the elements of large atomic number is represented as bright and the part formed of the elements of small atomic number is represented as dark.

Referring to FIG. 7A, in the case of conducting such a cleaning processing, it can be seen that there is formed a high resistance layer formed primarily of light elements (dark part) at the surface of the NiSi film 15S with the thickness of several nanometers as represented by an arrow.

Contrary to this, FIG. 7B shows the cross-sectional STEM photograph for the case the contact structure is formed by conducting the cleaning step of FIG. 1D by the sputter etching processing in the plasma of Ar and hydrogen as explained previously. In FIG. 7B, too, a dark view field image is represented similarly to the case of FIG. 7A.

Referring to FIG. 7B, it can be seen that the high resistance layer observed in FIG. 7A is vanished when the foregoing cleaning processing is conducted and that the tungsten plug 19S makes contact with the NiSi film 15S via the tungsten nitride barrier film 15S (can be seen as a slightly dark part).

Thereby, the NiSi film 15S is slightly etched (about 8 nm in the illustrated example) in correspondence to the part occupied by the high resistance layer.

While the present embodiment forms the contact structure in the structure in which the silicon nitride film 16 and the silicon oxide film 17 are laminated, the contact structure of the present embodiment is not limited to such a specific structure of the insulation films but it is also possible to form in a silicon oxide film or in an organic or inorganic low-K dielectric film.

Second Embodiment

FIGS. 8A-8D show the method of forming a multilayer interconnection structure according to a second embodiment of the present invention.

Figure 8A:
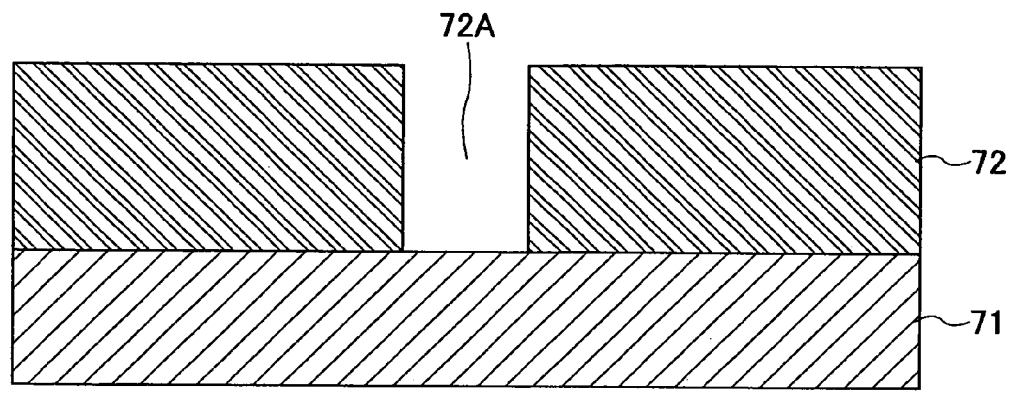
FIGS. 8A-8D are diagrams showing the process of forming a multilayer interconnection structure according to a second embodiment of the present invention.

Referring to FIG. 8A, there is formed a lower interconnection pattern 71 of Cu, or the like, on an insulation film (not shown) covering a substrate, and an interlayer insulation film 72 of $SiO_2$, for example, is formed by a plasma CVD process with a thickness of 1200 nm so as to cover the lower interconnection pattern 71.

Further, by using a lithographic process, a via-hole 72A is formed in the interlayer insulation film 72 by a lithographic process so as to expose the lower interconnection pattern 71. In the case the lower interconnection pattern 71 is a Cu interconnection pattern, the lower interconnection pattern is formed in an interconnection trench formed in the insulation film not illustrated by a damascene process.

Figure 8B:
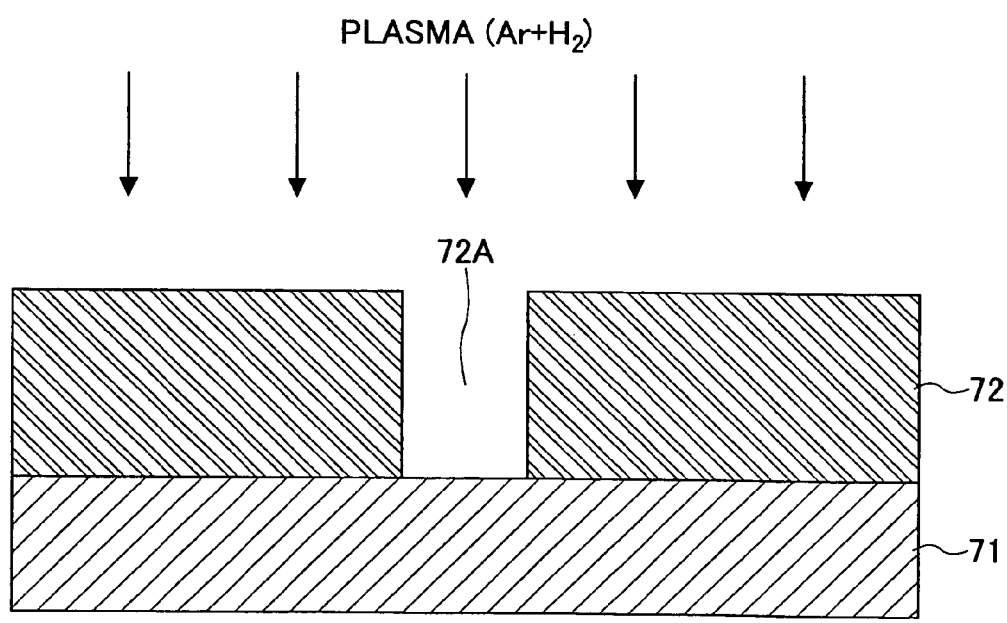

Next, in the step of FIG. 8B, the structure of FIG. 8A is introduced into the plasma processing apparatus 50 of FIG. 2, and sputter etching processing is conducted in the plasma containing Ar and hydrogen under the pressure of 0.5 mTorr at the substrate temperature of 200° C., for example, and while supplying an Ar gas and a hydrogen gas to the processing vessel 51 with respective flow rates of 10-30 SCCM and 10-30 SCCM, while supplying an RF power of 500 W to the showerhead 53 at the frequency of 400 kHz and further supplying an RF power of 100-300 W to the stage 52 at the frequency of 13.56 kHz. Thereby, oxide or contamination on the surface of the exposed lower interconnection pattern is removed and the surface of the exposed lower interconnection pattern is cleaned.

Alternatively, it is possible to conduct the cleaning processing by any of Ar sputtering, hydrogen reducing reaction, hydrogen plasma processing or $NF_3$ plasma processing.

In the case of conducting the cleaning processing by way of hydrogen reducing reaction, the processing may be conducted for 60-120 seconds under the pressure of 3 Torr at the temperature of 250° C. while supplying the hydrogen gas with the flow rate of 200 sccm.

Figure 8C:
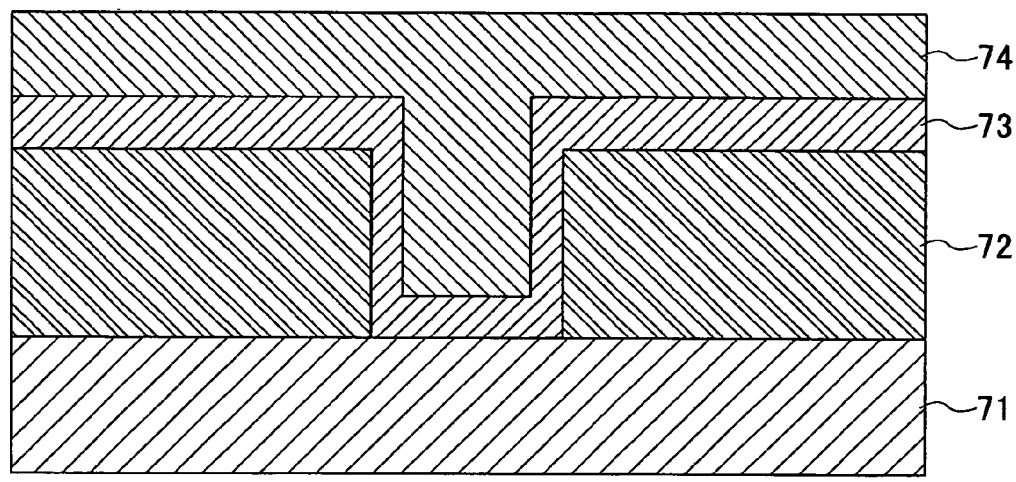

Next, in the step of FIG. 8C, the structure of FIG. 8B is transported to the substrate processing apparatus 60 of FIG. 3 via a vacuum transfer chamber, and a barrier metal film 73 of tungsten nitride is formed on the interlayer insulation film 72 by a pyrolitic CVD process similar to the one explained in the previous embodiment so as to cover the sidewall surface and bottom surface of the via hole 72A, by supplying a $WF_6$ gas, a $SiH_4$ gas, a $NH_3$ gas and a hydrogen gas together with an Ar gas, such that the nitrogen concentration in the tungsten nitride film decreases gradually similarly to the previous embodiment.

Further, in the step of FIG. 8C, a tungsten film 74 is formed by a pyrolitic CVD process similarly to the previous embodiment with a thickness of typically 100 nm so as to fill the via-hole 72A by continuously supplying the $WF_6$ gas, the $SiH_4$ gas and the hydrogen gas together with the Ar gas.

Figure 8D:
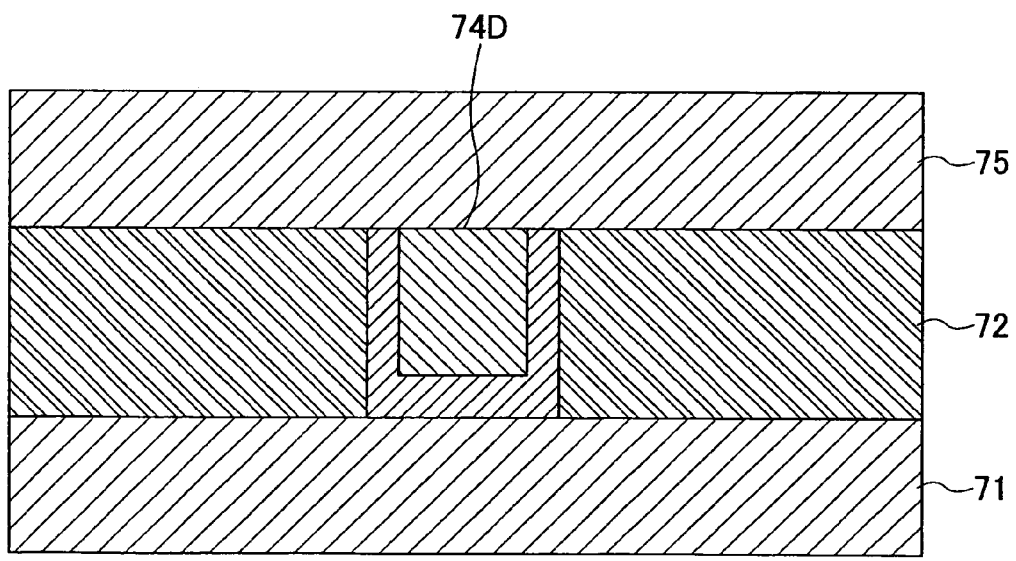

Further, by applying a CMP process in the step of FIG. 8D, the tungsten film 74 and the underlying barrier metal film 73 are polished out until the surface of the interlayer insulation film is exposed, and there is formed a tungsten plug 74P filling the via-hole 72A. In FIG. 8D, there is further formed a next interconnection pattern 75 on the interlayer insulation film 72.

Further, while the present embodiment has been explained for preferred embodiments, the present invention is by no means limited to such specific embodiments but various variations and modifications may be made without departing from the scope of the invention.

What is claimed is:

1. A semiconductor device having a contact structure, said contact structure comprising:
   a conductor body;
   an insulation film covering said conductor body;
   a contact hole penetrating through said insulation film and exposing said conductor body; and
   a contact plug filling said contact hole and contacting with said conductor body electrically at a bottom part of said contact hole,
   wherein said conductor body comprises a silicide film,
   said contact plug comprising a barrier metal film of tungsten nitride extending along a sidewall surface and a bottom surface of said contact hole and a tungsten plug formed over said barrier metal film to fill said contact hole,
   said barrier metal film having a concentration gradient that decreases a nitrogen concentration with increasing distance from said sidewall surface of said contact hole, and
   said barrier metal film contacting with said conductor body directly and intimately at a depressed part formed over a surface of said conductor body with a depth of 5-8 nm.

2. The semiconductor device as claimed in claim 1, wherein said semiconductor device has a gate length of 60 nm or less.

3. The semiconductor device as claimed in claim 1, wherein said semiconductor has a diffusion region having a junction depth of 100 nm or less, and wherein said conductor body comprises a silicide film formed on a surface of said diffusion region.

* * * * *